United States Patent
Mizutani

(10) Patent No.: US 10,648,839 B2
(45) Date of Patent: May 12, 2020

(54) PHOTOELECTRIC ENCODER

(71) Applicant: Mitutoyo Corporation, Kawasaki, Kanagawa (JP)

(72) Inventor: Miyako Mizutani, Kanagawa (JP)

(73) Assignee: MITUTOYO CORPORATION, Kawasaki (JP)

( * ) Notice: Subject to any disclaimer, the term of this patent is extended or adjusted under 35 U.S.C. 154(b) by 66 days.

(21) Appl. No.: 15/978,593

(22) Filed: May 14, 2018

(65) Prior Publication Data

US 2018/0335320 A1 Nov. 22, 2018

(30) Foreign Application Priority Data

May 22, 2017 (JP) ................................ 2017-101186
Apr. 18, 2018 (JP) ................................ 2018-080050

(51) Int. Cl.
| | | |
|---|---|---|
| G01D 5/347 | (2006.01) | |
| H01L 33/48 | (2010.01) | |
| H01L 33/54 | (2010.01) | |
| H01L 31/0216 | (2014.01) | |
| H01L 31/12 | (2006.01) | |
| H01L 33/62 | (2010.01) | |

(52) U.S. Cl.
CPC ..... G01D 5/34715 (2013.01); G01D 5/34707 (2013.01); *G01D 5/34746* (2013.01); *H01L 31/0216* (2013.01); *H01L 31/12* (2013.01); *H01L 33/483* (2013.01); *H01L 33/54* (2013.01); *H01L 33/62* (2013.01)

(58) Field of Classification Search
CPC ........... G01D 5/34746; G01D 5/34715; G01D 5/3473; G01D 5/34707; G01D 5/347; G01D 5/34776; H01L 31/0216; H01L 31/02162; H01L 31/02165; H01L 31/02168; H01L 31/12; H01L 33/62; G02B 27/30; G02B 6/002

See application file for complete search history.

(56) References Cited

U.S. PATENT DOCUMENTS

| | | | | |
|---|---|---|---|---|
| 5,479,010 A | * | 12/1995 | Shimomura | ....... G01D 5/34715 250/231.13 |
| 5,841,133 A | | 11/1998 | Omi | |
| 2005/0023450 A1 | * | 2/2005 | Ito | ...................... G01D 5/34715 250/231.13 |

(Continued)

FOREIGN PATENT DOCUMENTS

JP     H10-132612     5/1998

*Primary Examiner* — John R Lee
(74) *Attorney, Agent, or Firm* — Rankin, Hill & Clark LLP

(57) ABSTRACT

Provided is a photoelectric encoder that can achieve higher accuracy while maintaining reliability by reducing stray light. An encoder 1 is a photoelectric encoder including a light source device 2 that emits parallel light, a scale 3 having calibrations C provided along a measurement direction, and a light receiving unit 4 that receives light being emitted from the light source device 2, and transmitted through the scale 3. The encoder 1 includes an antireflection member 30 that prevents stray light generated by being reflected on the scale 3, from entering the light receiving unit 4. Because the encoder 1 includes the antireflection member 30, the encoder 1 can achieve higher accuracy while maintaining reliability by reducing stray light entering the light receiving unit 4.

3 Claims, 13 Drawing Sheets

(56) References Cited

U.S. PATENT DOCUMENTS

| | | | |
|---|---|---|---|
| 2010/0195118 A1* | 8/2010 | Horiguchi | G01D 5/38 356/616 |
| 2013/0001411 A1* | 1/2013 | Tojo | G01D 5/34723 250/227.11 |
| 2013/0112860 A1* | 5/2013 | Mizuno | G01D 5/34707 250/231.1 |
| 2015/0285662 A1* | 10/2015 | Nagura | G01D 5/38 250/231.1 |
| 2018/0106646 A1* | 4/2018 | Mizutani | G01D 5/34715 |
| 2018/0335320 A1* | 11/2018 | Mizutani | G01D 5/34715 |

* cited by examiner

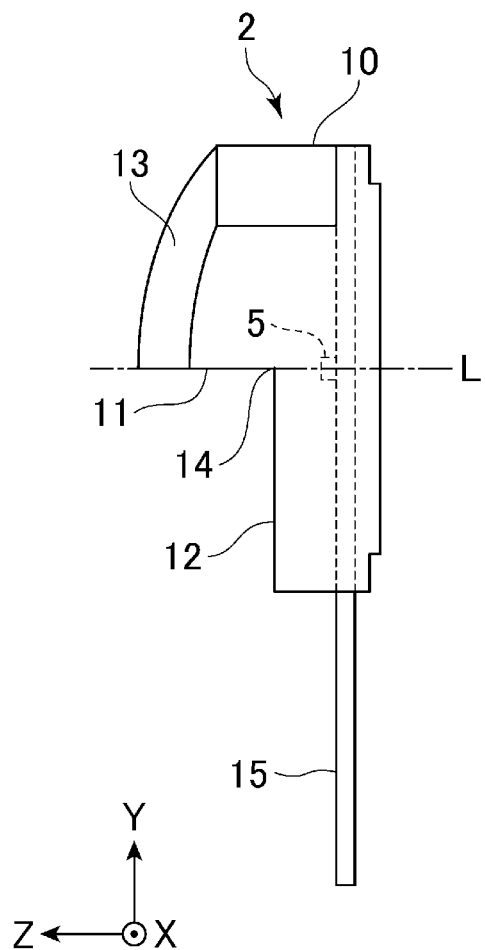 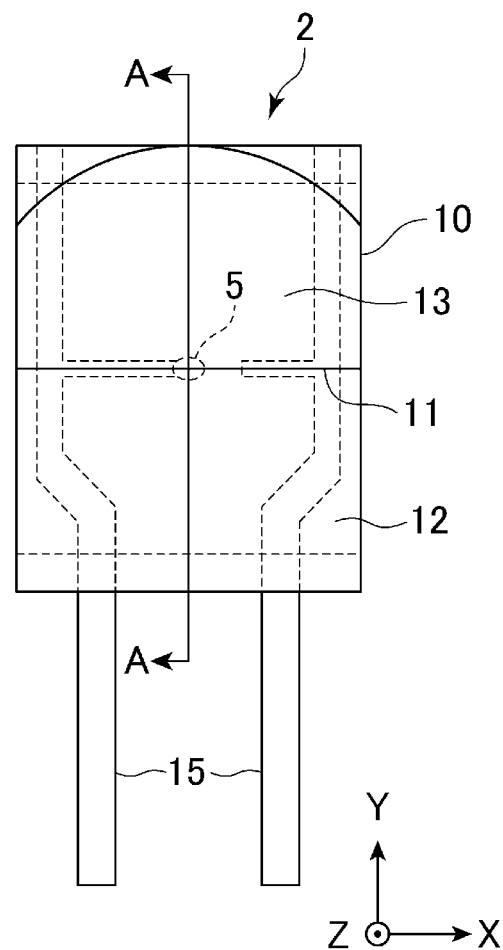
FIG. 2A  FIG. 2B
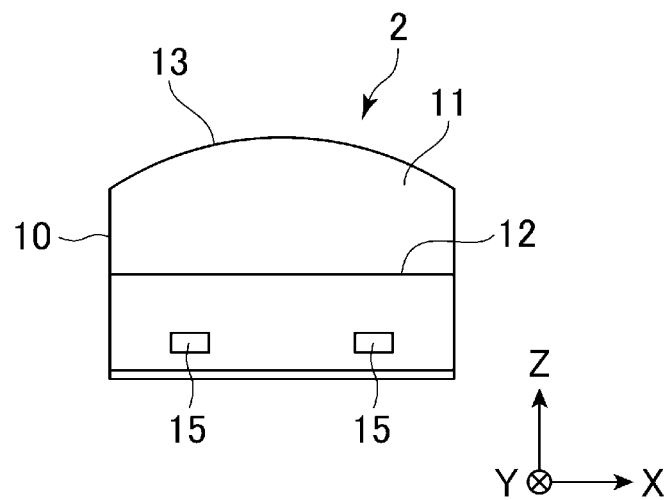
FIG. 2C

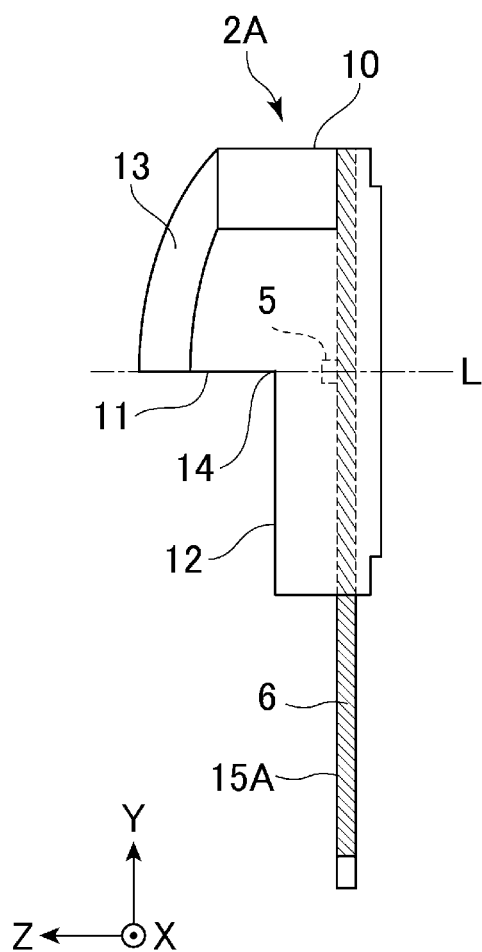
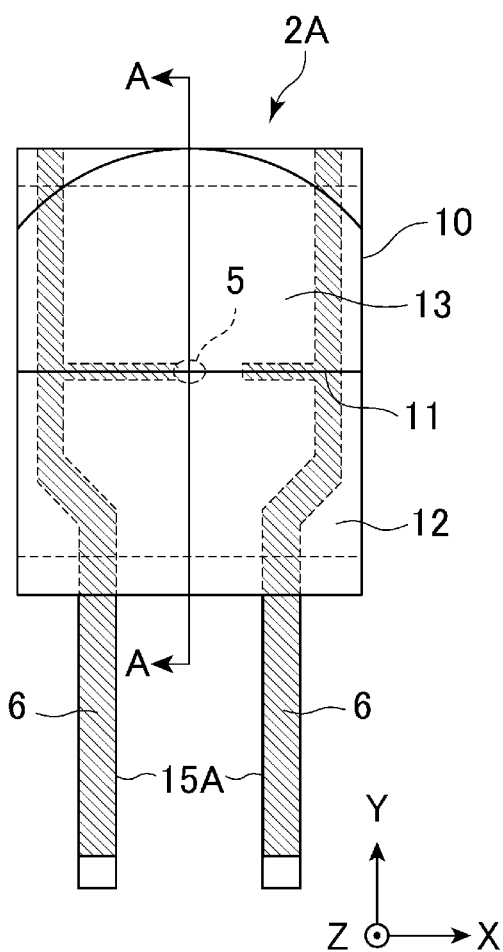
FIG. 6A   FIG. 6B
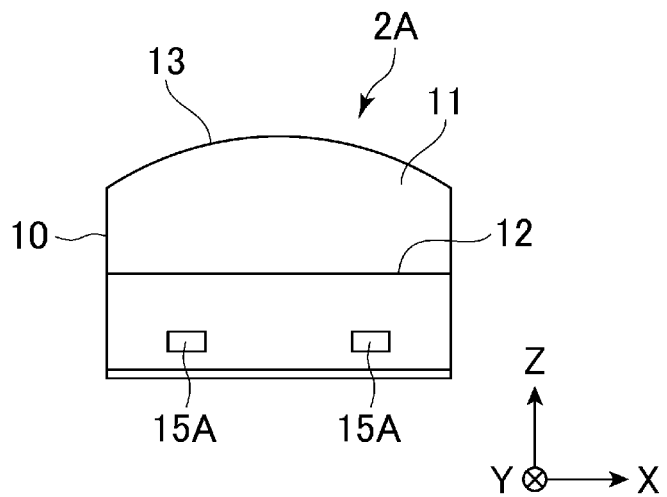
FIG. 6C

PHOTOELECTRIC ENCODER

CROSS-REFERENCE TO RELATED APPLICATION

This non-provisional application claims priority under 35 U.S.C. § 119(a) from Japanese Patent Application No. 2017-101186, filed on May 22, 2017, and Japanese Patent Application No. 2018-080050, filed on Apr. 18, 2018, the entire contents of which are incorporated herein by reference.

BACKGROUND

Technical Field

The present invention relates to a photoelectric encoder.

Background Art

There has been conventionally known a photoelectric encoder that includes a scale having calibrations, and a head including a light source device and a light receiving unit, and being configured to relatively move along the scale. The photoelectric encoder is configured to detect an amount of a relative movement between the scale and the head. For example, an optical displacement detection device (photoelectric encoder) described in JP 10-132612 A includes a light emission unit (light source device) configured to emit parallel light, a main scale (scale) onto which parallel light of the light emission unit is emitted, and a light receiving unit configured to receive light via the main scale.

FIG. 13 is a cross-sectional view illustrating a conventional light emission unit.

As illustrated in FIG. 13, a light emission unit 100 used in this optical displacement detection device includes a light emitting diode (LED) 101, transparent resin 103 including a plane 102 orthogonal to an optical axis L of the LED 101, a lens member 105 including a vertical plane 104 vertical to the plane 102, a reflection film 106 coating a surface of the lens member 105, a reflection plate 107 attached to the vertical plane 104, and an emission surface 108 that emits parallel light (solid-line arrows) reflected by the reflection film 106, to the outside of the light emission unit 100. In addition, in the light emission unit 100, a corner portion 200 is formed by the plane 102 and the vertical plane 104. The light emission unit 100 is integrally molded by injecting transparent resin into a die or the like, for example.

The lens member 105 has a curved surface having a shape obtained by further halving an approximate hemispheroid. This curved surface is coated with the reflection film 106 to function as a concave mirror. The light emission unit 100 obtains parallel light indicated by solid-line arrows, by disposing the LED 101 on an extended line of the vertical plane 104, and using light from the LED 101 that is emitted onto the reflection film 106 of the lens member 105.

By employing a shape obtained by further halving an approximate hemispheroid, as the shape of the lens member 105, the light emission unit 100 is downsized as compared with a case in which an approximate hemispheroid is employed.

SUMMARY OF THE INVENTION

Problems to be Solved by the Invention

Nevertheless, in such a light emission unit 100, if light is emitted onto the corner portion 200, the corner portion 200 becomes a scattering point of light, and emits light (broken-line arrows) inclined with respect to a light receiving surface of a light receiving unit, from the emission surface 108 to the outside of the light emission unit 100. In addition, due to the downsizing, the light emission unit 100 is susceptible to the effect of an angle variation caused by a misalignment, and even if an angle of the light emission unit 100 varies only slightly, it becomes difficult to emit parallel light vertically to the light receiving surface of the light receiving unit. In other words, due to the misalignment, the light emission unit 100 emits parallel light inclined with respect to the light receiving surface of the light receiving unit. The parallel light becomes stray light by being reflected on the scale.

The stray light generated by being reflected on the scale deteriorates narrow range accuracy, and causes degradation of detection efficiency in the detection of a relative movement amount in a photoelectric encoder. Thus, the photoelectric encoder has such a problem that detection accuracy and reliability cannot be sufficiently maintained due to the stray light.

The object of the present invention is to provide a photoelectric encoder that can achieve higher accuracy while maintaining reliability by reducing stray light.

Means for Solving the Problems

A photoelectric encoder of the present invention is a photoelectric encoder including a light source device configured to emit light (parallel light), a scale having calibrations provided along a measurement direction, and a light receiving unit configured to receive light (parallel light) being emitted from the light source device and transmitted through the scale, and an antireflection member configured to prevent stray light generated by being reflected on the scale, from entering the light receiving unit is included.

Here, the antireflection member refers to a member that can absorb or physically shield light. In other words, the antireflection member can prevent reflection of light (stray light).

According to the present invention as described above, because the photoelectric encoder includes the antireflection member configured to prevent stray light generated by being reflected on the scale, from entering the light receiving unit, stray light generated inside the photoelectric encoder can be prevented from entering the light receiving unit. In addition, the photoelectric encoder can execute measurement using parallel light with suppressed stray light.

Thus, the photoelectric encoder can achieve higher accuracy while maintaining reliability by reducing stray light.

At this time, the calibrations preferably include the antireflection member.

Here, calibrations provided on the scale are sometimes formed of metal such as Cu (copper) and Cr (chromium). If the calibrations are formed of metal, parallel light is reflected on one surface of the scale on which the calibrations are provided, and there is such a problem that stray light is generated.

Nevertheless, according to the present invention, because the calibrations include the antireflection member, stray light can be prevented from being generated by being reflected on one surface of the scale on which the calibrations are provided.

At this time, it is preferable that the light source device includes a lead frame that supplies power, and the lead frame includes the antireflection member.

Here, the lead frame included in the light source device is formed of metal such as Cu (copper) and Cr (chromium). In addition, as described above, the light source device is formed of transparent resin. Thus, stray light generated by being reflected on the scale is sometimes reflected toward the lead frame. There is such a problem that the lead frame further reflects the reflected stray light toward the scale, and the reflected light further becomes stray light by being reflected on the scale.

Nevertheless, according to the present invention, because the lead frame includes the antireflection member, stray light generated by being reflected on the scale can be prevented from being reflected on the lead frame, and entering the light receiving unit.

At this time, it is preferable that the scale includes the antireflection member on one surface, and the antireflection member suppresses reflected light entering the antireflection member and being reflected on one surface of the scale.

Here, light that has entered the scale is divided into transmitted light that is refracted and travels within the scale, and reflected light reflected on one surface of the scale. The reflected light reflected on one surface of the scale is sometimes reflected toward the lead frame or the like. There is such a problem that the lead frame or the like further reflects the reflected stray light toward the scale, and the reflected light further becomes stray light by being reflected on the scale.

Nevertheless, according to the present invention, because the scale includes the antireflection member on one surface, and the antireflection member suppresses reflected light entering the antireflection member and being reflected on one surface of the scale, stray light generated by being reflected on the scale can be prevented from entering the light receiving unit.

At this time, it is preferable that the light receiving unit includes a base portion that serves as a basement, and a light receiving portion that is disposed on the base portion, and converts received light into an electrical signal, and the base portion includes the antireflection member at a position other than the light receiving portion.

Here, the base portion of the light receiving unit includes a metal portion such as a plurality of wires in addition to the light receiving portion. Thus, parallel light that enters toward the light receiving unit sometimes enters toward the metal portion included in the light receiving unit, and the metal portion included in the base portion sometimes reflects the reflected parallel light toward the scale. Thus, there is such a problem that the parallel light reflected toward the scale becomes stray light by being reflected on the scale.

Nevertheless, according to the present invention, because the base portion of the light receiving unit includes the antireflection member at a position other than the light receiving portion, stray light can be prevented from being generated by being reflected on the metal portion included in the base portion, and further reflected on the scale.

At this time, it is preferable that the one surface of the scale is the surface on the light source device side, the scale further includes the antireflection member on one surface on the light receiving unit side, which is opposite to the surface on the light source device side, and the antireflection member on one surface on the light receiving unit side does not interfere the emission of the light transmitted through the scale, and suppresses the reflected light entering the antireflection member and being reflected on one surface of the scale of the light receiving unit side.

Here, as described above, light that has entered from one surface of the scale on the light source device side is divided into transmitted light that is refracted and travels within the scale, and reflected light reflected on one surface of the scale on the light source side. Then, the transmitted light is emitted from one surface of the scale on the light receiving unit side toward the light receiving unit. The transmitted light (parallel light) that is emitted from one surface on the light receiving unit side and enters toward the light receiving unit enters a light receiving portion included in the light receiving unit. Nevertheless the light receiving portion does not absorb all of the entered parallel light, and the light receiving portion sometimes reflects the entered parallel light toward the scale. Thus, there is such a problem that the parallel light reflects toward the scale becomes stray light by being reflected on the scale.

Nevertheless, according to the present invention, because the scale includes the antireflection member on both one surface on the light source device side and one surface on the light receiving unit side, and the antireflection member on one surface on the light receiving unit side does not interfere the emission of the light transmitted through the scale and suppresses the reflected light entering the antireflection member and being reflected on one surface of the scale of the light receiving unit side, it is possible to prevent the stray light generated by being reflected on the scale from entering the light receiving unit.

BRIEF DESCRIPTION OF THE DRAWINGS

FIG. 2A is a side view illustrating a light source device according to the first embodiment of the present invention; FIG. 2B is a top view illustrating the light source device according to the first embodiment of the present invention; FIG. 2C is a bottom view illustrating the light source device according to the first embodiment of the present invention;

FIG. 6A is a side view illustrating a light source device according to a second embodiment of the present invention; FIG. 6B is a top view illustrating the light source device according to the second embodiment of the present invention; FIG. 6C is a bottom view illustrating the light source device according to the second embodiment of the present invention;

DETAILED DESCRIPTION OF THE EMBODIMENTS

First Embodiment

A first embodiment of the present invention will be described below based on the drawings.

Figure 1:
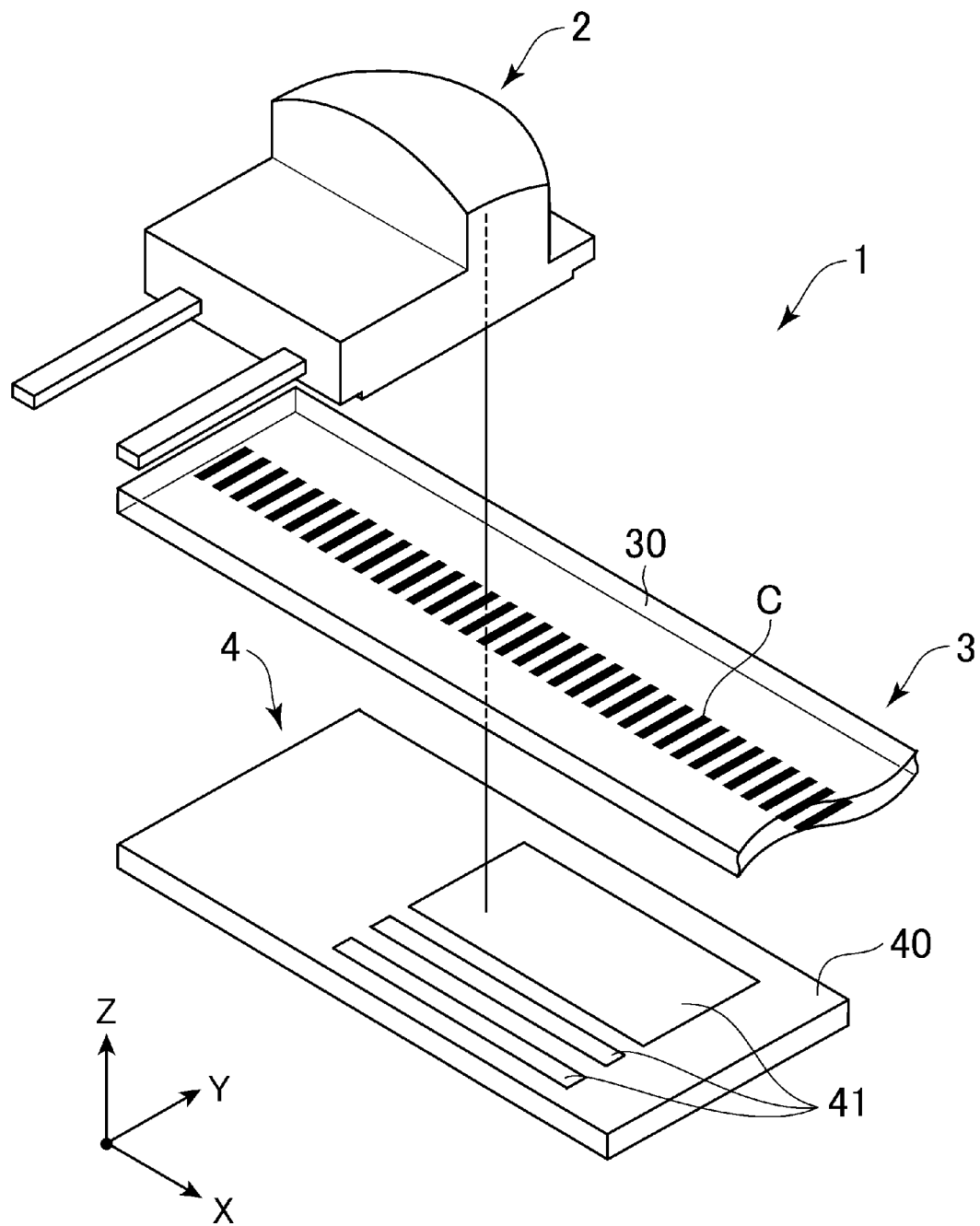
FIG. 1 is a perspective view illustrating an encoder according to a first embodiment of the present invention.

FIG. 1 is a perspective view illustrating an encoder according to the first embodiment of the present invention.

As illustrated in FIG. 1, an encoder 1 is a photoelectric encoder including a light source device 2 that emits parallel light, a scale 3 having calibrations C provided along a measurement direction, a light receiving unit 4 that receives parallel light being emitted from the light source device 2 and transmitted through the scale 3, and a head (not illustrated) that includes the light source device 2 and the light receiving unit 4, and relatively moves along the scale 3.

The encoder 1 detects an amount of a relative movement between the scale 3 and the head.

In the following description, in some cases, a longitudinal direction of the scale 3 and a movement direction of the light source device 2 and the head (the light source device 2 and the light receiving unit 4) are described as an X direction, a width direction of the scale 3 that is orthogonal to the X direction is described as a Y direction, and an up-down direction orthogonal to the X and Y directions is described as a Z direction.

The scale 3 is formed of translucent material such as glass, into an elongated shape, and includes a scale pattern alternately including transmissive portions and non-transmissive portions (calibrations C) along the longitudinal direction (X direction) being the measurement direction of the scale 3, and an anti-reflective coating 30 (AR coating) provided on one surface on a +Z direction side that faces the light source device 2.

The calibrations C are mainly formed of metal such as chromium (Cr).

The AR coating 30 is an antireflection member that suppresses reflected light entering the AR coating 30 and being reflected on one surface of the scale 3 that faces the light source device 2. The details of the AR coating 30 will be described later.

The parallel light transmitted through the scale 3 generates interference fringes having the same cycle as the scale pattern, on the light receiving unit 4.

The light receiving unit 4 includes a base portion 40 that serves as a basement, and a light receiving portion 41 that is disposed on the base portion 40, and converts received light into an electrical signal.

The base portion 40 is formed into an approximate rectangular shape, and the light receiving portion 41 is disposed on a surface facing the scale 3. The base portion 40 includes a metal portion such as a wire, in addition to the light receiving portion 41.

The light receiving portion 41 detects interference fringes generated by being transmitted through the scale 3, and converts the interference fringes into an electrical signal. The encoder 1 calculates the electrical signal obtained by the light receiving portion 41, to detect an amount of a relative movement between the scale 3 and the head.

FIGS. 2A to 2C are a side view, a top view, and a bottom view of the light source device according to the first embodiment of the present invention, respectively. More specifically, FIG. 2A is a side view of the light source device 2, FIG. 2B is a top view of the light source device 2, and FIG. 2C is a bottom view of the light source device 2.

As illustrated in FIGS. 2A to 2C, the light source device 2 includes a light emitting unit 5 that emits light, and a translucent member 10 that accommodates the light emitting unit 5 therein, and makes light emitted from the light emitting unit 5, into parallel light.

For example, an LED is used as the light emitting unit 5.

The translucent member 10 includes an optical axis plane 11 positioned on an optical path of the light emitting unit 5, and being parallel to an optical axis L of the light emitting unit 5, an orthogonal plane 12 formed with being connected to an end portion on the light emitting unit 5 side (−Z direction side) of the optical axis plane 11, positioned on the optical path of the light emitting unit 5, and being orthogonal to the optical axis L of the light emitting unit 5, a paraboloidal surface 13 formed with being connected to an end portion on an opposite side (+Z direction side) of the light emitting unit 5 of the optical axis plane 11 toward an opposite side (+Y direction side) of the orthogonal plane 12, and making light from the light emitting unit 5, into parallel light, and a corner portion 14 formed by vertically connecting the optical axis plane 11 and the orthogonal plane 12, and a lead frame 15 for a power source that links the light source device 2 and a power source (not illustrated).

The translucent member 10 is integrally molded by injecting transparent resin into a die or the like, for example. In addition, the light emitting unit 5 accommodated inside the translucent member 10 is disposed on an extended line of the optical axis plane 11.

The lead frame 15 supports and fixes the light emitting unit 5 or the like inside the translucent member 10, and is formed by processing a thin plate made of metal material such as copper (Cu), by etching or the like. The lead frame 15 supplies power to the light emitting unit 5.

Figure 3:
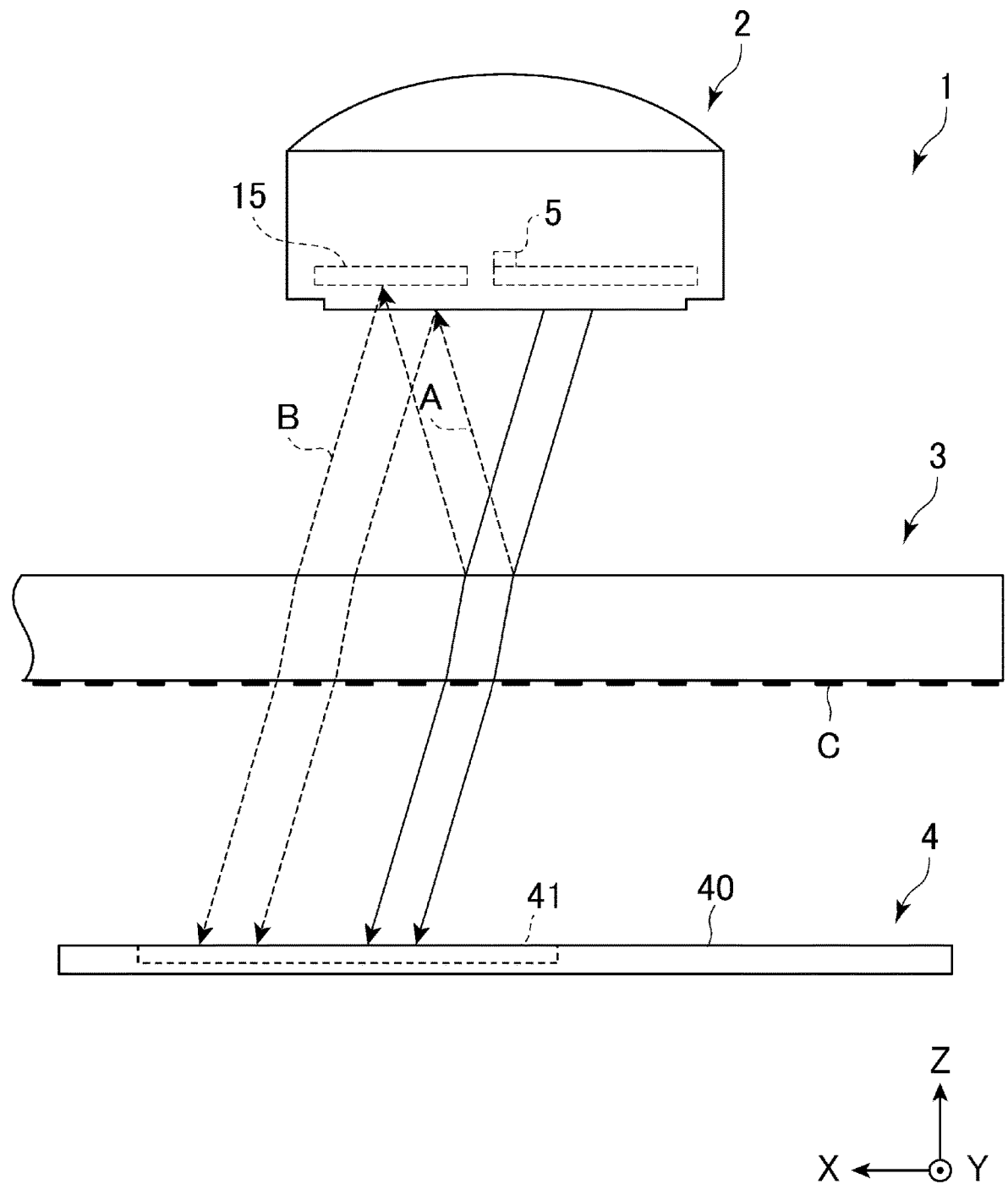
FIG. 3 is diagram illustrating an optical path of stray light of a conventional encoder.

FIG. 3 is diagram illustrating an optical path of stray light of a conventional encoder.

Here, an optical path of stray light generated by being reflected on the scale 3 will be described.

Solid-line arrows indicate inclined parallel light generated by a misalignment of the light source device 2. Broken-line arrows indicate stray light generated by being reflected on the scale 3. In addition, a broken-line arrow A indicates optical path of stray light reflected on an emission surface of parallel light that is included in the light source device 2, and a broken-line arrow B indicates an optical path of stray light reflected on the lead frame 15.

As illustrated in FIG. 3, stray light (the broken-line arrows A and B) is sometimes generated by being reflected on one surface of the scale 3 that faces the light source device 2. The stray light is reflected toward the light source device 2. The stray light reflected toward the light source device 2 is further reflected on the emission surface of parallel light that is included in the light source device 2 (the broken-line arrow A), the lead frame 15 (the broken-line arrow B), or the like, to enter the scale 3. The stray light that has entered the scale 3 enters the light receiving unit 4, deteriorates narrow range accuracy of interference fringes to be detected by the light receiving portion 41, and causes degradation of detection efficiency.

Figure 4:
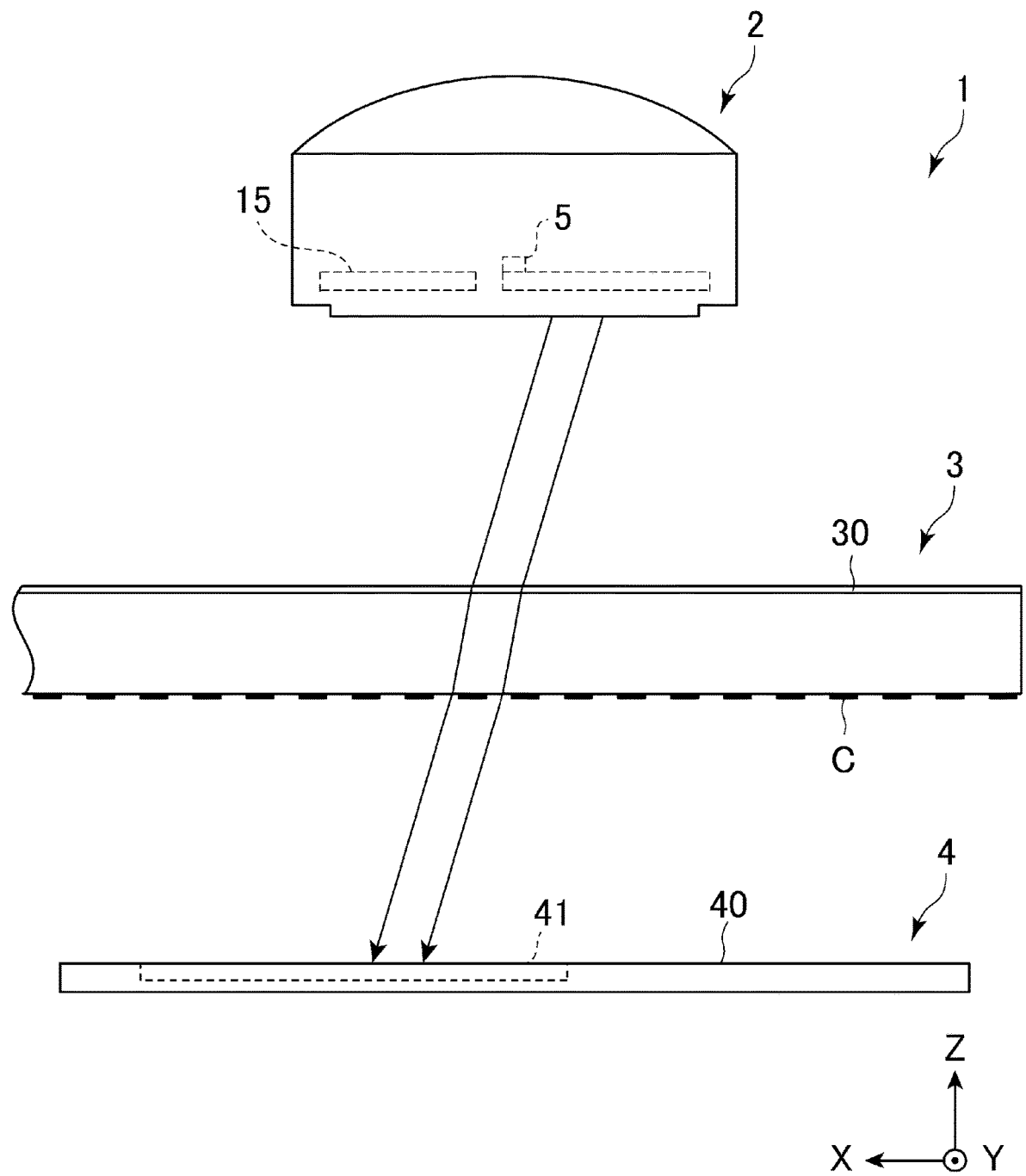
FIG. 4 is a diagram illustrating an optical path of parallel light of the encoder according to the first embodiment of the present invention.

FIG. 4 is a diagram illustrating an optical path of parallel light of the encoder according to the first embodiment of the present invention.

As illustrated in FIG. 4, the AR coating 30 being an antireflection member is a transparent thin film. Light that has entered the scale 3 is divided into transmitted light that is refracted and travels within the scale 3, and reflected light reflected on one surface of the scale 3 that faces the light source device 2. By forming a thin film on one surface of the scale 3 that faces the light source device 2, the AR coating 30 can cancel reflected light entering the AR coating 30 and being reflected on one surface of the scale 3, due to interference of light. Thus, because the AR coating 30 causes reflected light (stray light) reflected on one surface of the scale 3, not to be emitted toward the light source device 2, stray light can be suppressed.

According to the present embodiment as described above, the following functions and effects can be brought about.

(1) Because the encoder 1 includes the AR coating 30 being an antireflection member configured to prevent stray light generated by being reflected on the scale 3, from entering the light receiving unit 4, stray light generated inside the encoder 1 can be prevented from entering the light receiving unit 4. In addition, the encoder 1 can execute measurement using parallel light with suppressed stray light.

Thus, the encoder 1 can achieve higher accuracy while maintaining reliability by reducing stray light.

(2) Because the scale 3 includes the AR coating 30 being an antireflection member, on one surface that faces the light source device 2, and the AR coating 30 suppresses reflected light entering the AR coating 30 and being reflected on one surface of the scale 3, stray light generated by being reflected on the scale 3 can be prevented from entering the light receiving unit 4.

Second Embodiment

A second embodiment of the present invention will be described below based on the drawings.

In the following description, parts that have been already described are assigned the same signs, and the descriptions thereof will be omitted.

Figure 5:
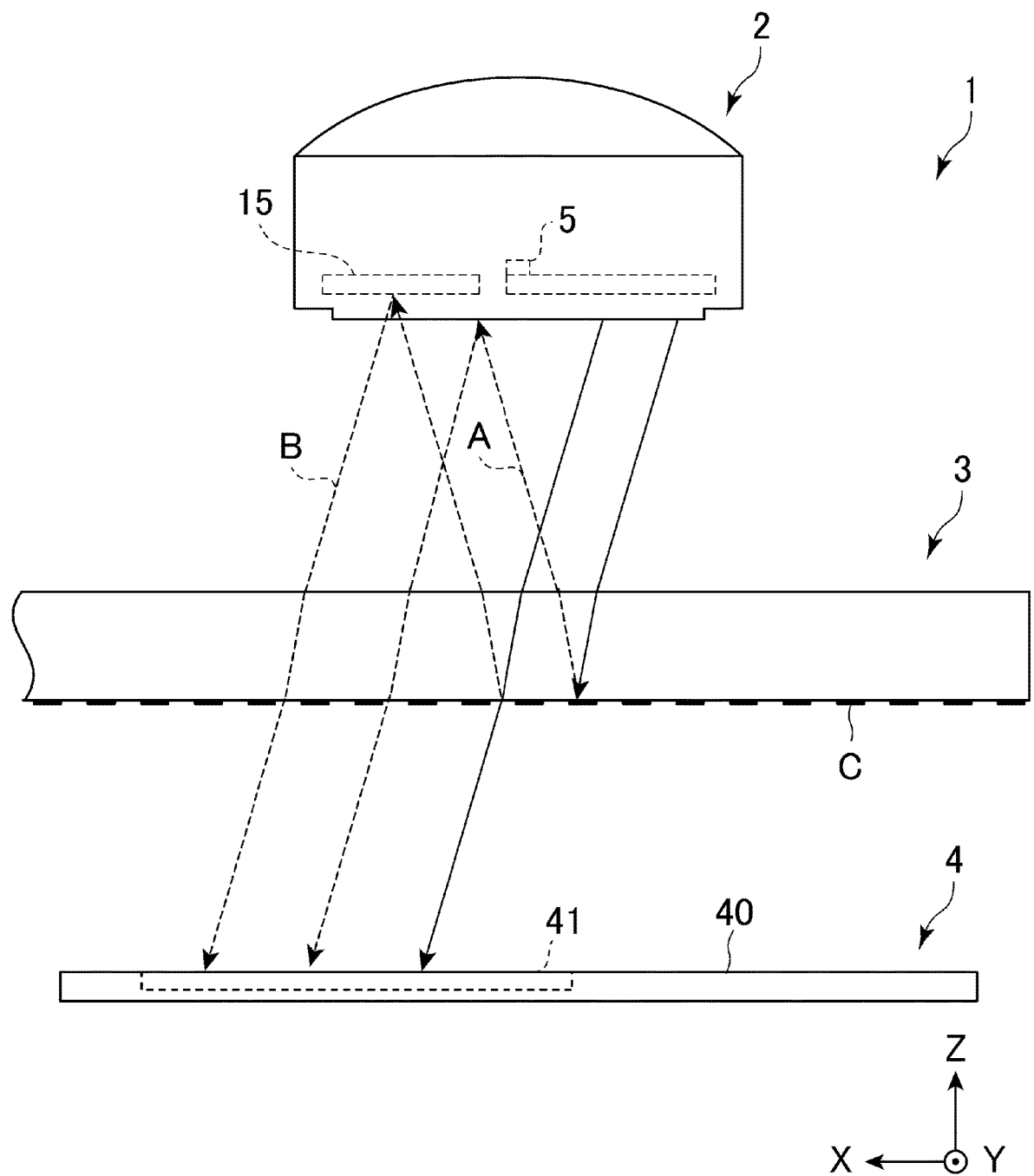
FIG. 5 is diagram illustrating an optical path of stray light of a conventional encoder.

FIG. 5 is diagram illustrating an optical path of stray light of a conventional encoder.

Here, an optical path of stray light generated by being reflected on the scale 3 that is different from FIG. 3 will be described. Solid-line arrows indicate inclined parallel light generated by a misalignment of the light source device 2. Broken-line arrows indicate stray light generated by entering the scale 3 and being reflected on one surface of the scale 3 on which the calibrations C are provided. A broken-line arrow A indicates optical path of stray light reflected on an emission surface of parallel light that is included in the light source device 2, and a broken-line arrow B indicates an optical path of stray light reflected on the lead frame 15.

As illustrated in FIG. 5, inclined parallel light (solid-line arrows) sometimes generates stray light (the broken-line arrows A and B) by entering the scale 3 and being reflected on one surface on which the calibrations C are provided. The stray light is emitted from one surface of the scale 3 that fasces the light source device 2, toward the light source device 2. The emitted stray light is further reflected on the emission surface of parallel light that is included in the light source device 2 (the broken-line arrow A), or the lead frame 15 (the broken-line arrow B), to enter the scale 3. The stray light that has entered the scale 3 enters the light receiving unit 4, deteriorates narrow range accuracy of interference fringes to be detected by the light receiving portion 41, and causes degradation of detection efficiency.

FIGS. 6A to 6C are a side view, a top view, and a bottom view of the light source device according to the second embodiment of the present invention, respectively. More specifically, FIG. 6A is a side view of a light source device 2A, FIG. 6B is a top view of the light source device 2A, and FIG. 6C is a bottom view of the light source device 2A.

The lead frame 15 included in the light source device 2 of the above-described first embodiment is formed of metal material such as Cu. In contrast to this, in the present embodiment, as illustrated in FIGS. 6A to 6C, a lead frame 15A included in the light source device 2A differs from the above-described first embodiment in that an antireflection member 6 is included.

More specifically, the antireflection member 6 included in the lead frame 15A is insulating coating with black color or the like, paint of black color or the like that absorbs light, or the like.

Figure 7:
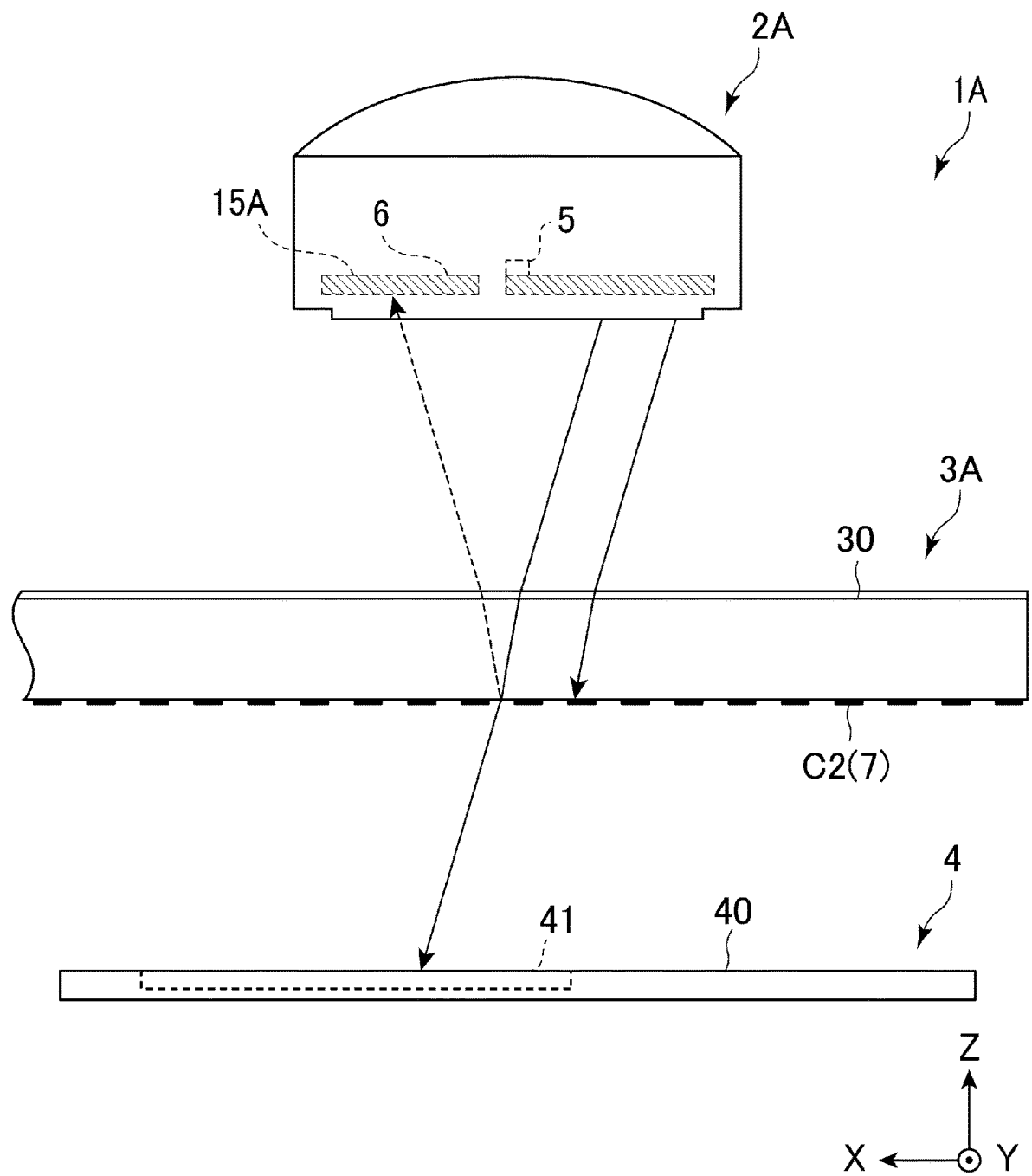
FIG. 7 is a diagram illustrating an optical path of parallel light of the encoder according to the second embodiment of the present invention.

FIG. 7 is a diagram illustrating an optical path of parallel light of the encoder according to the second embodiment of the present invention.

The calibrations C included in the scale 3 of the above-described first embodiment are formed of metal material such as Cu. In contrast to this, in the present embodiment, as illustrated in FIG. 7, calibrations C2 included in a scale 3A differ from the above-described first embodiment in that an antireflection member 7 is included on one surface that faces the light source device 2A, and one surface that faces the light receiving unit 4. More specifically, the antireflection member 7 included in the calibrations C2 is chrome oxide (CrO), paint of black color or the like, or the like. In addition, the antireflection member 7 may be provided only on one surface of the calibrations C2 that faces the light source device 2A.

As illustrated in FIG. 7, stray light (refer to FIG. 5) generated by entering the scale 3A and being reflected on one surface on which the calibrations C2 are provided is absorbed and shielded by the antireflection member 7 included in the calibrations C2. In addition, stray light (broken-line arrow) generated by being reflected on one surface of the scale 3A on which the calibrations C2 are provided is emitted from the scale 3A toward the lead frame 15A, and absorbed by the antireflection member 6 included in the lead frame 15A. Thus, because the stray light does not enter the light receiving unit 4, only parallel light can enter the light receiving unit 4.

Also in the present embodiment as described above, the following functions and effects can be brought about in addition to functions and effects similar to (1) to (2) in the above-described first embodiment.

(3) Because the encoder 1A includes the antireflection members 6 and 7 configured to prevent stray light generated by being reflected on the scale 3A, from entering the light receiving unit 4, stray light generated inside the encoder 1A can be prevented from entering the light receiving unit 4. In addition, the encoder 1A can execute measurement using parallel light with suppressed stray light.

Thus, the encoder 1A can achieve higher accuracy while maintaining reliability by reducing stray light.

(4) Because the lead frame 15A includes the antireflection member 6, stray light generated by being reflected on the scale 3A can be prevented from being reflected on the lead frame 15A, and entering the light receiving unit 4.

(5) Because the calibrations C2 include the antireflection member 7, stray light can be prevented from being generated by being reflected on one surface of the scale 3A on which the calibrations C2 are provided.

Third Embodiment

A third embodiment of the present invention will be described below based on the drawings.

In the following description, parts that have been already described are assigned the same signs, and the descriptions thereof will be omitted.

Figure 8:
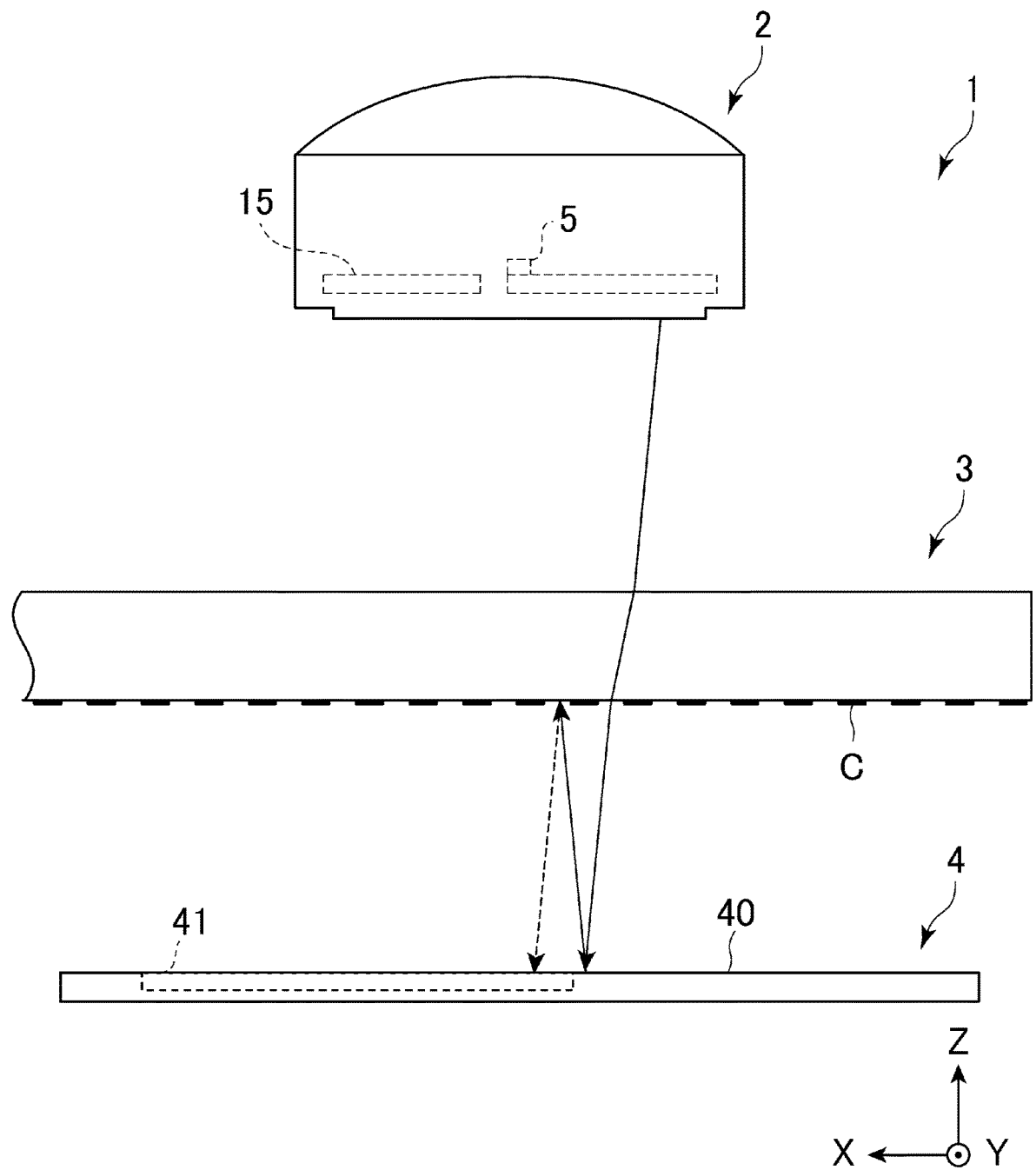
FIG. 8 is a diagram illustrating an optical path of stray light of a conventional encoder.

FIG. 8 is diagram illustrating an optical path of stray light of a conventional encoder.

Here, an optical path of stray light generated by being reflected on the scale 3 that is different from FIGS. 3 and 5 will be described. A solid-line arrow indicates inclined parallel light generated by a misalignment of the light source device 2. In addition, a broken-line arrow indicates stray light generated by further reflecting light reflected on the metal portion of the base portion 40 of the light receiving unit 4, on the scale 3.

As illustrated in FIG. 8, inclined parallel light (solid-line arrow) is sometimes transmitted through the scale 3, and reflected on a metal portion (not illustrated) included in the base portion 40 of the light receiving unit 4. The stray light is reflected toward one surface of the scale 3 that faces the light receiving unit 4, and is further reflected on the scale 3, thereby becoming stray light (broken-line arrow) and entering toward the light receiving unit 4. The stray light that has entered the light receiving unit 4 deteriorates narrow range accuracy of interference fringes to be detected by the light receiving portion 41, and causes degradation of detection efficiency.

Figure 9:
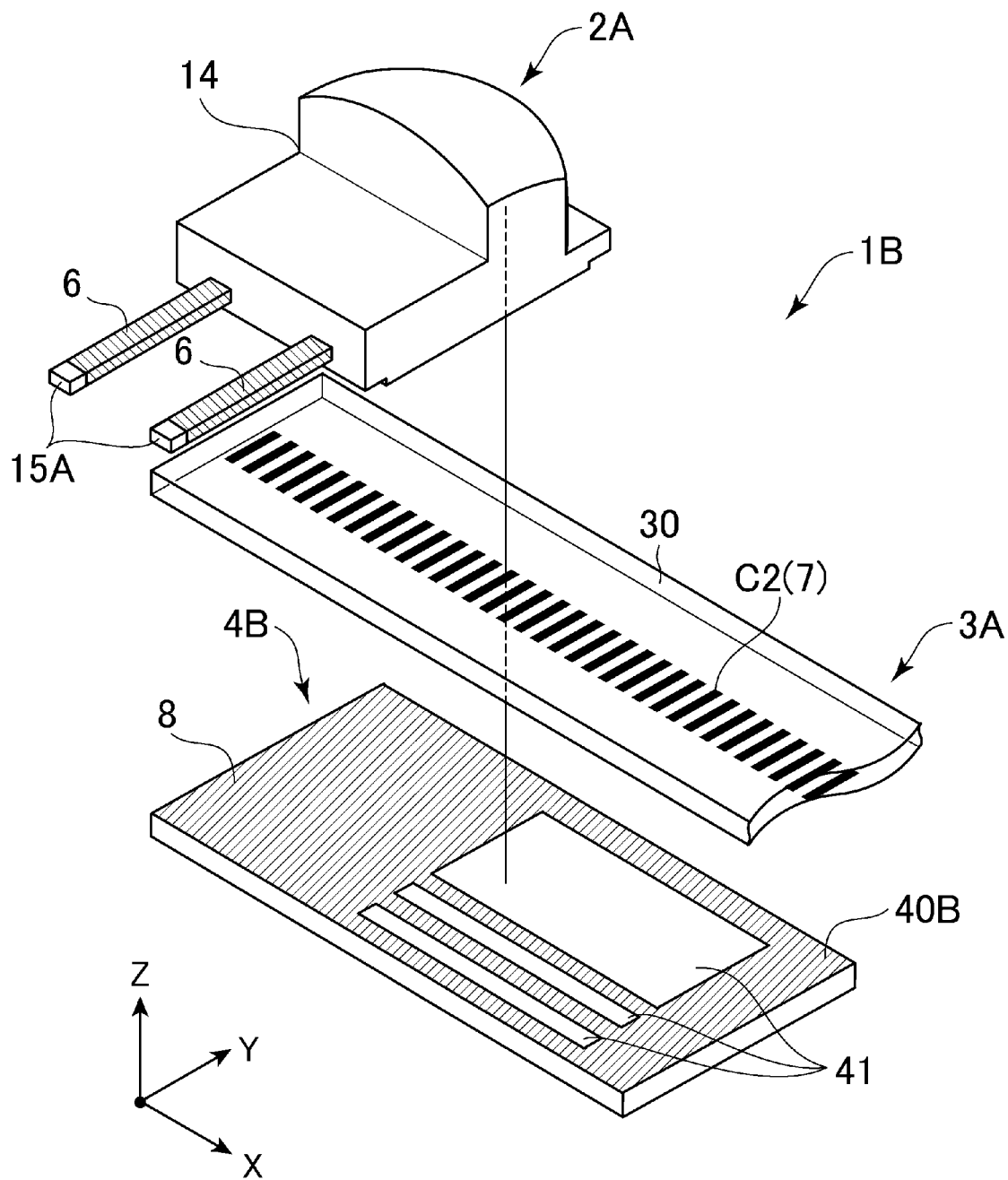
FIG. 9 is a perspective view illustrating an encoder according to a third embodiment of the present invention.

FIG. 9 is a perspective view illustrating an encoder according to the third embodiment of the present invention.

The light receiving unit 4 of the encoder 1A of the above-described second embodiment does not include an antireflection member. In contrast to this, as illustrated in FIG. 9, a base portion 40B of a light receiving unit 4B of an encoder 1B of the present embodiment differs from the above-described first and second embodiments in that an antireflection member 8 is included at a position other than the light receiving portion 41.

More specifically, the antireflection member 8 is paint of black color or the like, or insulating material such as rubber with black color or the like, and resin. In addition, the antireflection member 8 may be an AR coating.

Figure 10:
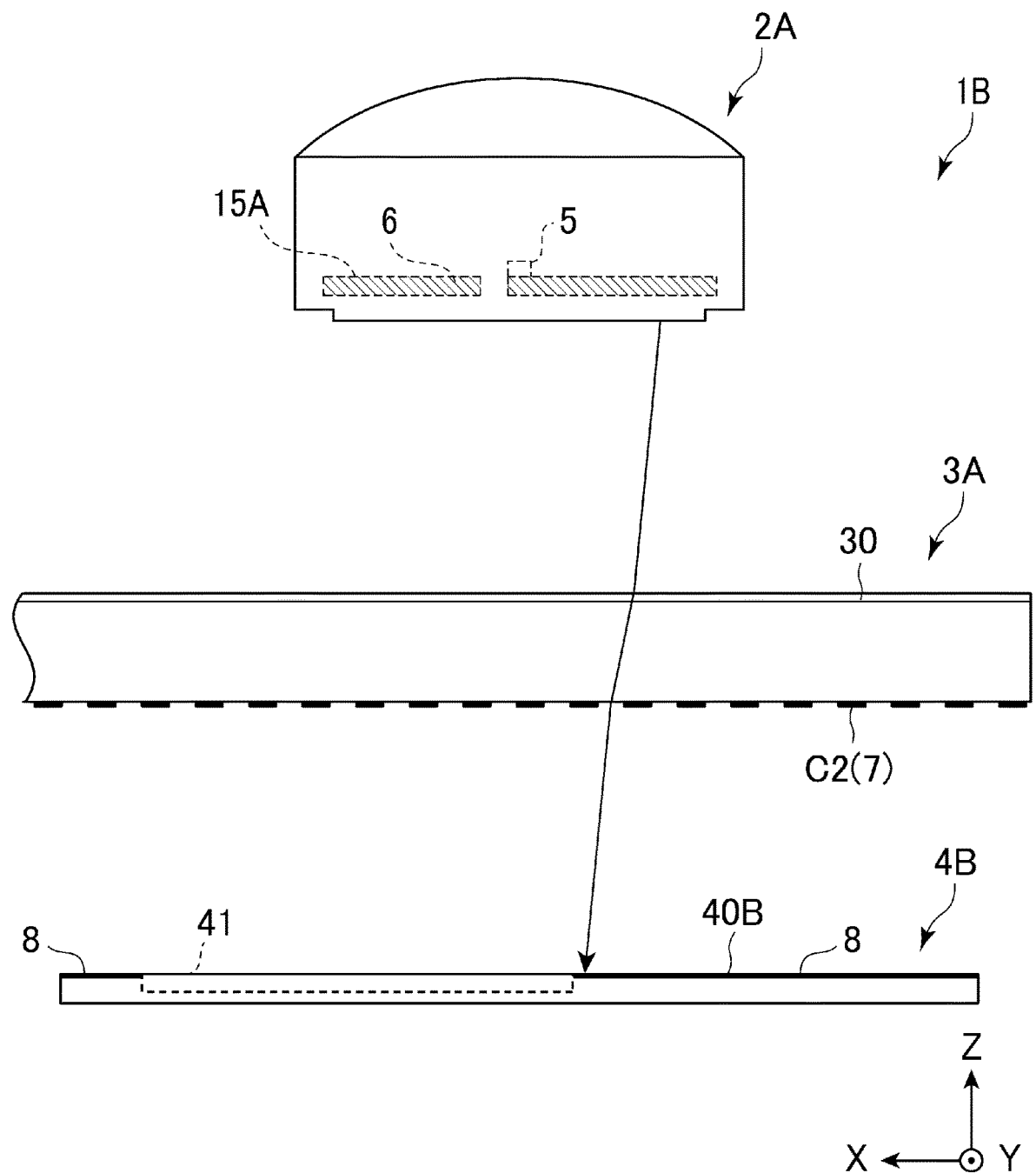
FIG. 10 is a diagram illustrating an optical path of parallel light of the encoder according to the third embodiment of the present invention.

FIG. 10 is a diagram illustrating an optical path of parallel light of the encoder according to the third embodiment of the present invention.

As illustrated in FIG. 10, stray light transmitted through the scale 3A is absorbed by the antireflection member 8 included in the base portion 40B of the light receiving unit 4B. Thus, the antireflection member 8 can prevent stray light from being generated by being reflected toward one surface of the scale 3A that faces the light receiving unit 4B, and further reflected on the scale 3A.

Also in the present embodiment as described above, the following functions and effects can be brought about in addition to functions and effects similar to those in the above-described first and second embodiments.

(6) Because the encoder 1B includes the antireflection member 8 configured to prevent stray light generated by being reflected on the scale 3A, from entering the light receiving unit 4B, stray light generated inside the encoder 1B can be prevented from entering the light receiving unit 4B. In addition, the encoder 1B can execute measurement using parallel light with suppressed stray light.

Thus, the encoder 1B can achieve higher accuracy while maintaining reliability by reducing stray light.

(7) Because the base portion 40B of the light receiving unit 4B includes the antireflection member 8 at a position other than the light receiving portion 41, stray light can be prevented from being generated by being reflected on the metal portion included in the base portion 40, and further reflected on the scale 3A.

Fourth Embodiment

A fourth embodiment of the present invention will be described below based on the drawings.

In the following description, parts that have been already described are assigned the same signs, and the descriptions thereof will be omitted.

Figure 11:
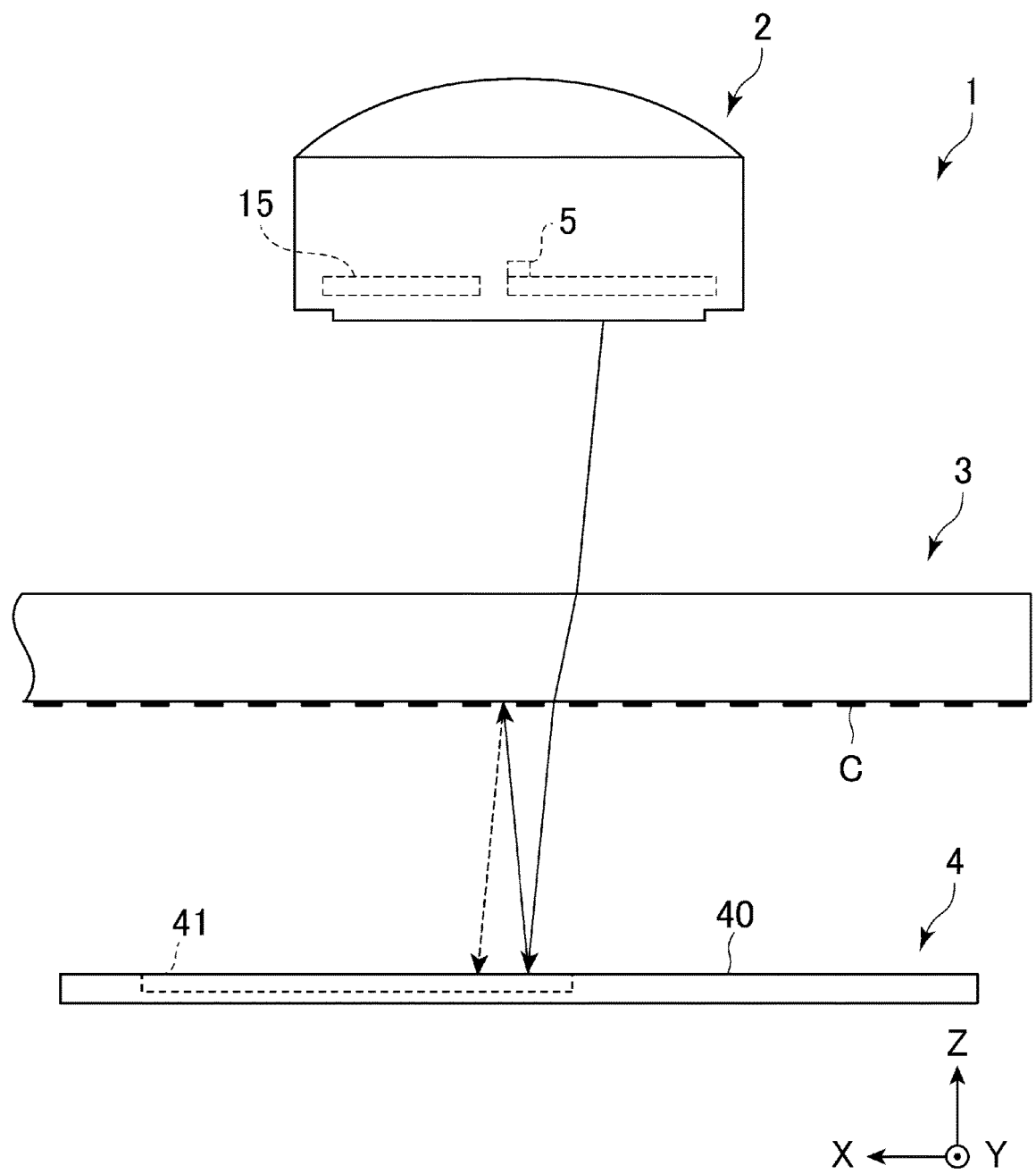
FIG. 11 is diagram illustrating an optical path of stray light of a conventional encoder.

FIG. 11 is diagram illustrating an optical path of stray light of a conventional encoder.

Here, an optical path of stray light generated by being reflected on the scale 3 that is different from FIGS. 3, 5 and 8 will be described. A solid-line arrow indicates inclined parallel light generated by a misalignment of the light source device 2. In addition, a broken-line arrow indicates stray light generated by further reflecting light reflected on the light receiving portion 41 of the light receiving unit 4, on the scale 3.

As illustrated in FIG. 11, inclined parallel light (solid-line arrow) is transmitted through the scale 3, is emitted from one surface of the scale 3 that faces the light receiving unit 4, and enters the light receiving portion 41. The light receiving portion 41 does not absorb all of the entered parallel light, and reflects a part of the entered parallel light toward one surface of the scale 3 that faces the light receiving unit 4. Then, the light reflected on the light receiving portion 41 becomes stray light (broken-line arrow) by being reflected on one surface of the scale 3 that faces the light receiving unit 4, entering toward the light receiving unit 4 again. The stray light deteriorates narrow range accuracy of interference fringes to be detected by the light receiving portion 41, and causes degradation of detection efficiency.

Figure 12:
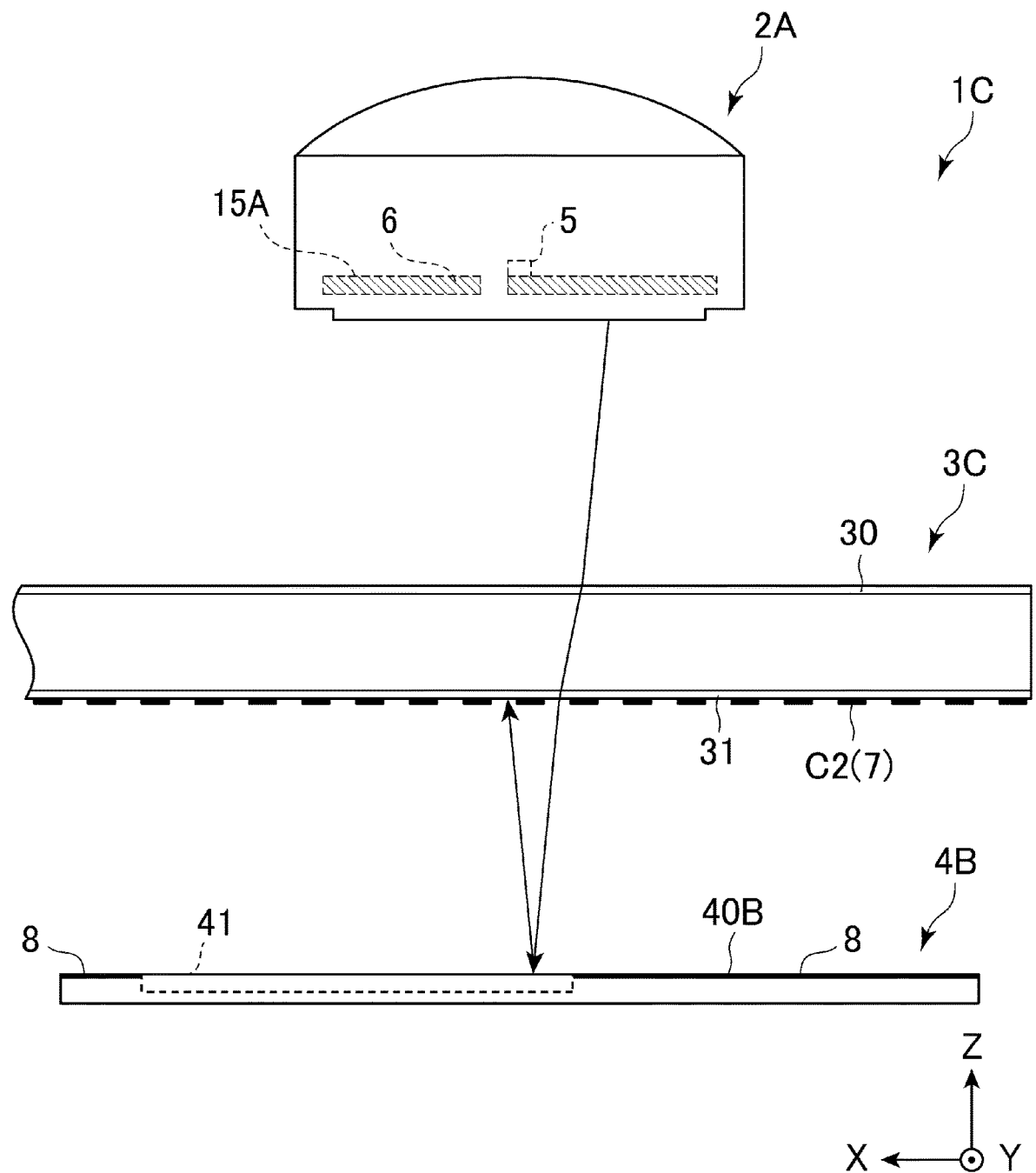
FIG. 12 is a diagram illustrating an optical path of parallel light of the encoder according to the fourth embodiment of the present invention.
Figure 13:
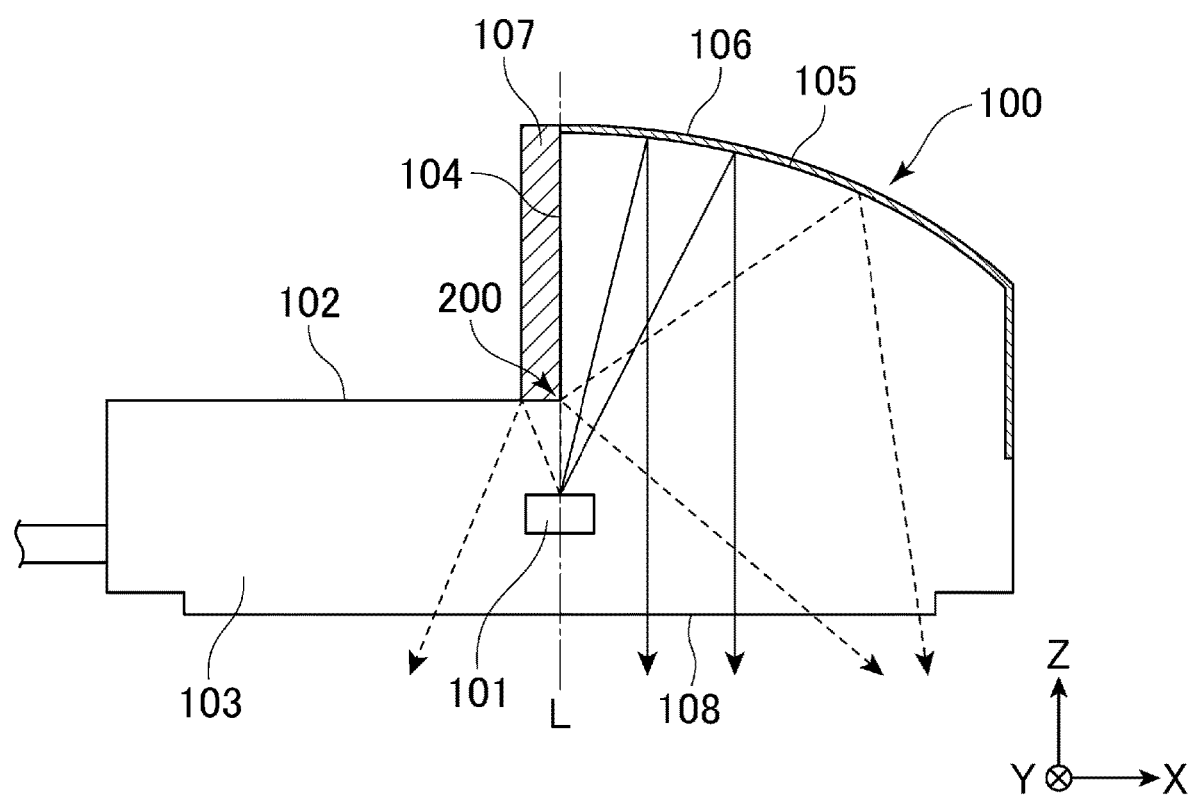
FIG. 13 is a cross-sectional view illustrating a conventional light emission unit.

FIG. 12 is a diagram illustrating an optical path of parallel light of the encoder according to the fourth embodiment of the present invention.

The scale 3 or 3A of the encoders 1, 1A or 1B in the above described embodiments include the AR coating 30, which is an antireflection member, on one surface on a +Z direction side (the light source device 2 or 2A side) that faces the light source device 2 or 2A.

As illustrated in FIG. 12, a scale 3C of an encoder 1C of the present embodiment differs from the above-described embodiments in that an AR coating 31, which is an antireflection member, is provided on one surface on a −Z direction side (the light receiving unit 4B side) that faces the light receiving unit 4B side.

The AR coating 31 being an antireflection member is a transparent thin film similar to the AR coating 30. By forming thin film on one surface of the scale 3c on the light receiving unit 4B side, the AR coating 31 can cancel reflected light entering the AR coating 31 and being reflected on one surface on the light receiving unit 4B side, due to interference of light. Thus, because the AR coating 31 suppresses that the light reflected on the light receiving portion 41 from being further reflected on one surface of the scale 3C on the light receiving unit 4B side, thereby becoming stray light. In addition, even if the antireflection member 8 included in the base portion 40B of the light receiving unit 4B can not absorb the parallel light emitted toward the member other than the light receiving portion 41 and the parallel light is reflected toward one surface of the scale 3C on the light receiving unit 4B side, since the scale 3C includes AR coating 31, the stray light due to the reflection on one surface of the scale 3C on the light receiving unit 4B side can be prevented.

Also in the present embodiment as described above, the following functions and effects can be brought about in addition to functions and effects in the above-described embodiments.

(8) Because AR coating 31 on one surface of the scale 3C on the light receiving unit 4B side does not interfere the emission of the light transmitted through the scale 3C, and suppresses the reflected light entering the AR coating 31 and being reflected on one surface of the scale 3C on the light receiving unit 4B side, stray light generated by reflection on the scale 3C can be prevented from entering the light receiving unit 4B.

Modification of Embodiments

The present invention is not limited to the above-described embodiments, and modifications, alterations, and the like that fall within the scope capable of accomplishing the object of the present invention are included in the present invention.

For example, in the above-described first embodiment, the scale 3 includes the AR coating 30 being an antireflection member, in the above-described second embodiment, the calibrations C2 and the lead frame 15A include the antireflection members 6 and 7, and in the above-described third embodiment, the base portion 40B of the light receiving unit 4B includes the antireflection member 8. Nevertheless, an antireflection member may be provided in another region in an encoder.

In the first embodiment to the third embodiment, scale 3, 3A is provided AR coating 30 on one surface of that faces the light source device 2, 2A (the light source device 2, 2A side). Nevertheless, a scale may include an AR coating on one surface of the scale on a light receiving unit side.

In other words, the encoder is only required to include an antireflection member that prevents stray light generated by being reflected on a scale, from entering a light receiving unit.

In the above-described embodiments, the light source devices 2 and 2A include the translucent member 10 having a shape obtained by further halving an approximate hemispheroid. Nevertheless, the light source device may have any configuration as long as an LED or the like is included.

In the embodiments, the scales 3 and 3A include the calibrations C and C2 on a surface facing the light receiving units 4 and 4B. Nevertheless, the calibrations C and C2 need not be included on the surface facing the light receiving units 4 and 4B. In other words, the scale is only required to include calibrations, and may include calibrations on a surface facing the light source device, inside the scale, or the like.

INDUSTRIAL APPLICABILITY

As described above, the present invention can be preferably used in a photoelectric encoder that can achieve higher accuracy while maintaining reliability by reducing stray light.

What is claimed is:

1. A photoelectric encoder comprising a light source device configured to emit light, a scale having scale pattern alternately including transmissive portions and non-transmissive portions along a longitudinal measurement direction, and a light receiving unit configured to receive light being emitted from the light source device and transmitted through the scale,
   wherein an antireflection member configured to prevent stray light generated by being reflected on the scale, from entering the light receiving unit is included,
   wherein the non-transmissive portions include the antireflection member.

2. A photoelectric encoder comprising a light source device configured to emit light, a scale having calibrations provided along a measurement direction, and a light receiving unit configured to receive light being emitted from the light source device and transmitted through the scale,
   wherein an antireflection member configured to prevent stray light generated by being reflected on the scale, from entering the light receiving unit is included,
   wherein the light source device includes a lead frame that supplies power and a light emitting unit fixedly supported by the lead frame, and
   wherein the lead frame includes the antireflection member on the entire surface excluding the portion that supports the light emitting unit.

3. A photoelectric encoder comprising a light source device configured to emit light, a scale having calibrations provided along a measurement direction, and a light receiving unit configured to receive light being emitted from the light source device and transmitted through the scale,
   wherein an antireflection member configured to prevent stray light generated by being reflected on the scale, from entering the light receiving unit is included,
   wherein the light receiving unit includes:
   a base portion that serves as a basement; and
   a light receiving portion that is disposed on the base portion, and converts the received light into an electrical signal, and
   wherein the base portion includes
   the antireflection member on the entire surface excluding the light receiving portion.

* * * * *